(12) United States Patent
Teng

(10) Patent No.: US 10,070,227 B2
(45) Date of Patent: Sep. 4, 2018

(54) DIAPHRAGM OF SOUNDING APPARATUS

(71) Applicant: Ko-Chung Teng, Taipei (TW)

(72) Inventor: Ko-Chung Teng, Taipei (TW)

(*) Notice: Subject to any disclaimer, the term of this patent is extended or adjusted under 35 U.S.C. 154(b) by 0 days.

(21) Appl. No.: 15/503,181

(22) PCT Filed: Oct. 24, 2014

(86) PCT No.: PCT/CN2014/000945
§ 371 (c)(1),
(2) Date: Feb. 10, 2017

(87) PCT Pub. No.: WO2016/061713
PCT Pub. Date: Apr. 28, 2016

(65) Prior Publication Data
US 2017/0238098 A1   Aug. 17, 2017

(51) Int. Cl.
*H04R 7/06* (2006.01)
*H04R 31/00* (2006.01)
(Continued)

(52) U.S. Cl.
CPC ............ *H04R 7/06* (2013.01); *H04R 31/003* (2013.01); *B81C 1/00182* (2013.01); *H04R 7/10* (2013.01);
(Continued)

(58) Field of Classification Search
CPC ... H04R 7/04; H04R 7/06; H04R 7/08; H04R 7/10; H04R 31/003; H04R 31/00;
(Continued)

(56) References Cited

U.S. PATENT DOCUMENTS 4,939,784 A * 7/1990 Bruney .................. H04R 7/10
                                                              181/170
5,259,036 A * 11/1993 Seeler .................. H04R 7/125
                                                              181/170
(Continued)

FOREIGN PATENT DOCUMENTS

CN       1087770 A    6/1994
CN       1666569 A    9/2005
(Continued)

OTHER PUBLICATIONS

International Search Report issued in PCT/CN2014/000945 dated Jul. 13, 2015.

*Primary Examiner* — Davetta W Goins
*Assistant Examiner* — Oyesola C Ojo
(74) *Attorney, Agent, or Firm* — Hauptman Ham, LLP

(57) ABSTRACT

The present invention provides a diaphragm structure of a sounding apparatus comprising: a thin-film layer; a first circuit thin-film layer fixed on a first side of the thin-film layer by means of a first electrolytic bonding layer; a second circuit thin-film layer fixed on a second side of the thin-film layer by means of a second electrolytic bonding layer; multiple holes passing through the first circuit thin-film layer, the thin-film layer and the second circuit thin-film layer; and multiple conductive layers disposed on inner circumferential walls of the holes and in contact with the first circuit thin-film layer and the second circuit thin-film layer. In the diaphragm structure provided by the present invention, instead of using back adhesives, electrolytic bonding is used to fix the circuit thin-film layers on two sides of a thin-film layer, thereby greatly reducing the thickness of the diaphragm structure.

5 Claims, 5 Drawing Sheets

(51) Int. Cl.
*H04R 7/10* (2006.01)
*B81C 1/00* (2006.01)

(52) U.S. Cl.
CPC .... *H04R 2307/00* (2013.01); *H04R 2307/027* (2013.01)

(58) Field of Classification Search
CPC .......... H04R 9/04; H04R 19/02; H04R 23/00; C23C 18/16; C23C 18/31; C23C 28/00; C23C 28/02; C25D 5/56; C25D 7/00; Y10T 29/49005
USPC ........ 381/176, 399, 427; 181/157, 167, 168, 181/170
See application file for complete search history.

(56) References Cited

U.S. PATENT DOCUMENTS

| | | | | |
|---|---|---|---|---|
| 5,627,903 | A * | 5/1997 | Porrazzo | H04R 7/10 381/423 |
| 6,151,398 | A * | 11/2000 | Norris | G10K 9/13 367/140 |
| 6,327,372 | B1 * | 12/2001 | Devantier | H04R 7/125 181/167 |
| 7,539,324 | B2 * | 5/2009 | Polfreman | C25D 9/06 381/423 |
| 7,687,411 | B2 * | 3/2010 | Fujitani | B32B 5/022 181/199 |
| 8,116,512 | B2 * | 2/2012 | Levitsky | H04R 9/025 381/399 |
| 8,284,964 | B2 * | 10/2012 | Windischberger | H04R 7/10 162/128 |
| 8,718,297 | B1 * | 5/2014 | Norris | G10K 15/02 381/111 |
| 9,324,315 | B2 * | 4/2016 | Yuen | H04R 7/125 |
| 2003/0021436 | A1 * | 1/2003 | Wu | H04R 7/122 381/426 |
| 2006/0104473 | A1 | 5/2006 | Polfreman et al. | |
| 2006/0289203 | A1 * | 12/2006 | Oda | H01L 21/486 174/264 |
| 2007/0190881 | A1 * | 8/2007 | Shibaoka | D03D 1/0088 442/228 |
| 2009/0027833 | A1 * | 1/2009 | Lee | F03G 7/005 361/523 |
| 2009/0304225 | A1 * | 12/2009 | Kamimura | H04R 7/127 381/423 |
| 2011/0026757 | A1 * | 2/2011 | Takahashi | H04R 7/125 381/397 |

FOREIGN PATENT DOCUMENTS

| | | |
|---|---|---|
| CN | 204259145 U | 4/2015 |
| JP | 2000345369 A | 12/2000 |
| TW | 201119417 A1 | 6/2011 |
| TW | 201129124 A1 | 8/2011 |
| TW | M448101 U1 | 3/2013 |

* cited by examiner

DIAPHRAGM OF SOUNDING APPARATUS

RELATED APPLICATIONS

The present application is a National Phase of International Application Number PCT/CN2014/000945, filed Oct. 24, 2014.

BACKGROUND OF THE INVENTION

1. Field of the Invention

The present invention generally relates to a diaphragm structure, and particularly relates to a diaphragm structure, of which on the thin-film metal coils are fixed by electrolytic bonding, thereby the thickness of a sounding apparatus monomer is greatly reduced.

2. The Prior Arts

According to the differences in structures and principles of sounding, sounding apparatus can be classified into several types such as moving coil type speakers, piezoelectric speakers, piezoelectric ceramic speakers and paper speakers. Amongst the above mentioned speakers, the most common one is the conventional moving coil type speaker. The structure of the moving coil type speaker is formed by the following steps: firstly, winding an enameled coil on the outer circumference of a cylindrical tube to form a voice coil; secondly, adhering one end of the voice coil at one side of a diaphragm; lastly, disposing the diaphragm at one side of a magnet to form a moving coil type speaker monomer. When using this type of monomer for sounding, corresponding audio frequency current is passed through the enameled coil such that the magnetic field of the coil is changed by electromagnetic induction to drive the diaphragm to vibrate, thereby vibrating the air to sound. The moving coil type monomer is advantageous in having good sound quality at low and medium frequency. However, due to its large size, moving coil type speakers are not suitable for apparatuses with small volumes. Besides, since the moving coil type speaker has a greater monomer thickness, it has poorer performance at high frequency.

In conventional monomer structures, voice coils are fixed onto the thin-film by ways of back adhesive. Since available adhesives in the art possess a certain thickness, such a fixing method would result in a monomer with a greater overall thickness; as a result, the overall size of a sounding apparatus, such as earphones, with such a monomer and the overall size of the earphones cannot be reduced. In addition, as the sensibility of the sounding apparatus is required to be improved, it is common to increase the magnetic flux density by increasing the number of coils. However, since the conventional fixation by back adhesive results in an overly thick thickness of the monomer after the number of the coils is increased, designs of the sounding apparatus and earphones are restricted.

SUMMARY OF THE INVENTION

Based on the above reasons, an objective of the present invention is to provide a diaphragm structure with metal coils fixed on thin-films by ways of electrolytic bonding instead of back adhesive. In such a way, the thickness of the diaphragm is greatly reduced.

Another objective of the present invention is to provide a diaphragm structure in which a plurality of metal coils and a plurality of thin-films are laminated and fixed alternately by ways of electrolytic bonding, such that the diaphragm structure may have a greater magnetic flux while the thickness remains unchanged.

In order to achieve the above-mentioned objectives, the present invention provides a diaphragm structure that includes a thin-film layer, a first circuit thin-film layer, a second circuit thin-film layer and at least one conductive structure. The thin-film layer has a first side and a second side. The first circuit thin-film layer is fixed to the first side of the thin-film layer by means of a first electrolytic bonding layer and the first circuit thin-film layer has a first contact terminal at one end. The second circuit thin-film layer is fixed to the second side of the thin-film layer by means of a second electrolytic bonding layer and the second circuit thin-film layer has a second contact terminal at one end. The at least one conductive structure penetrates through the thin-film layer to connect the first circuit thin-film layer and the second circuit thin-film layer.

According to an embodiment of the present invention, the conductive structure includes a perforation and a conductive layer. The perforation penetrates from an outer surface of the first circuit thin-film layer through the thin-film layer to an outer surface of the second circuit thin-film layer. The conductive layer is disposed on an inner circumferential wall of the perforation and the conductive layer is in contact with the first circuit thin-film layer and the second circuit thin-film layer simultaneously.

In addition, the present invention provides another diaphragm structure that includes a thin-film layer, a first circuit thin-film layer, at least one laminated layer, a second circuit thin-film layer and a plurality of conductive structures. The thin-film layer has a first side and a second side. The first circuit thin-film layer is fixed to the first side of the thin-film layer by means of a first electrolytic bonding layer and the first circuit thin-film layer has a first contact terminal at one end. Each of the at least one laminated layer includes a third circuit thin-film layer and a laminated thin-film layer. The laminated thin-film layer is fixed to the third circuit thin-film layer by means of a laminated electrolytic bonding layer. The third circuit thin-film layer at an outermost side of the at least one laminated layer is fixed to the second side of the thin-film layer by means of a third electrolytic bonding layer. The second circuit thin-film layer is fixed to the laminated thin-film layer at another outermost side of the at least one laminated layer by means of a second electrolytic bonding layer and the second circuit thin-film layer has a second contact terminal at one end. Herein, every two adjacent circuit thin-film layers among the first circuit thin-film layer, the second circuit thin-film layer and at least one third circuit thin-film layer are connected to each other by means of at least one conductive structure.

According to an embodiment of the present invention, each of the conductive structures includes a perforation and a conductive layer. The perforation penetrates from a former one of the two adjacent circuit thin-film layers through the laminated thin-film layer or the thin-film layer between the two adjacent circuit thin-film layers to a later one of the two adjacent circuit thin-film layers. The conductive layer is disposed on an inner circumferential wall of the perforation and the conductive layer is in contact with the two adjacent circuit thin-film layers.

According to an embodiment of the present invention, the diaphragm structure further comprises a plurality of covering parts. The covering parts are disposed on the outer surface of the first circuit thin-film layer and on the outer surface of the second circuit thin-film layer around all of the perforations, and the covering parts are in contact with the conductive layers in the perforations.

According to an embodiment of the present invention, the diaphragm structure comprises a plurality of laminated layers. Every two laminated layers are fixed with each other by means of laminated electrolytic bonding layer in between.

DETAILED DESCRIPTION OF THE PREFERRED EMBODIMENT

The drawings and reference symbols are incorporated hereafter to further illustrate the embodiments of the present invention so that the present invention can be implemented by a person skilled in the art.

Figure 1:
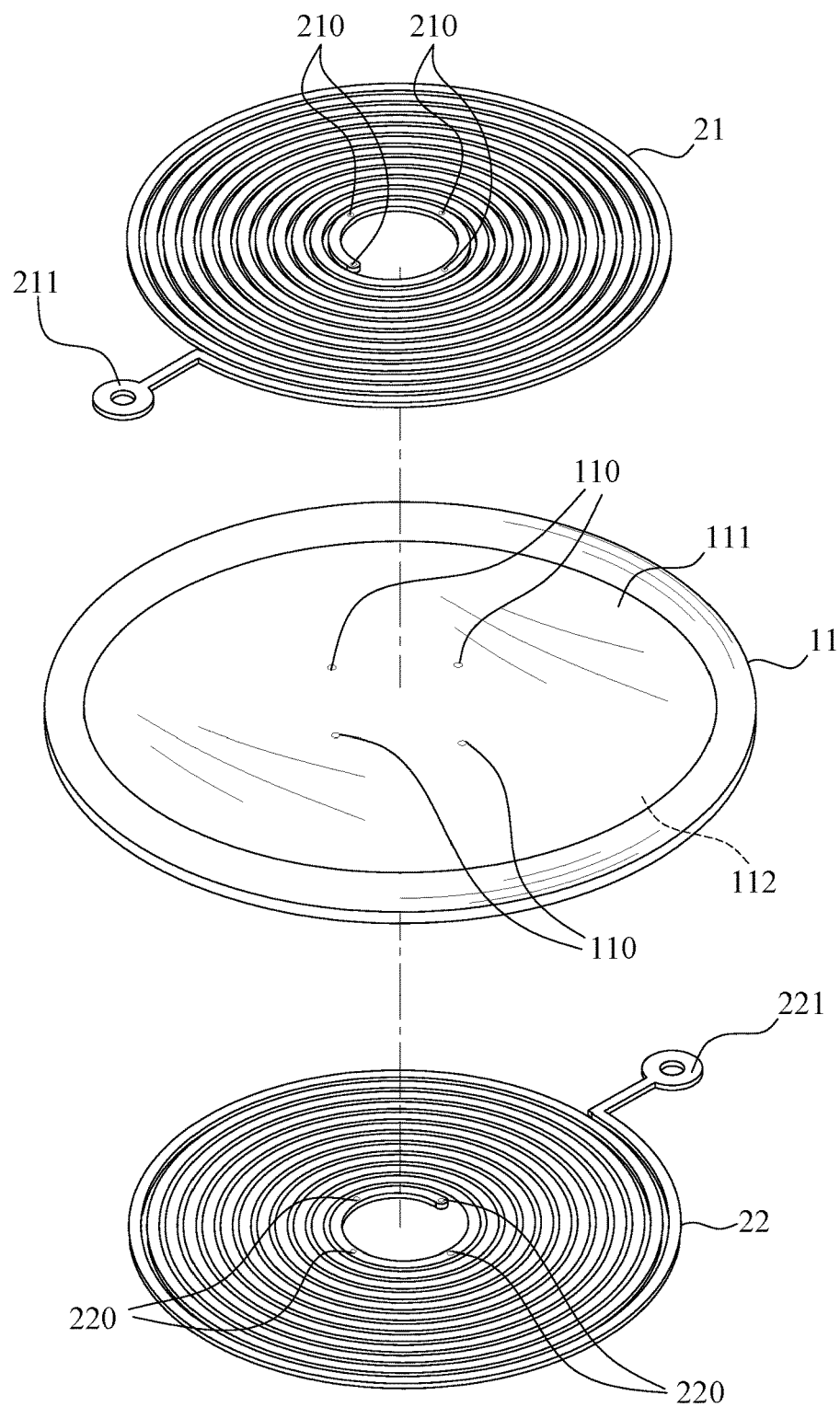
FIG. 1 is an exploded diagram of the diaphragm structure according to a first embodiment of the present invention.
Figure 2:
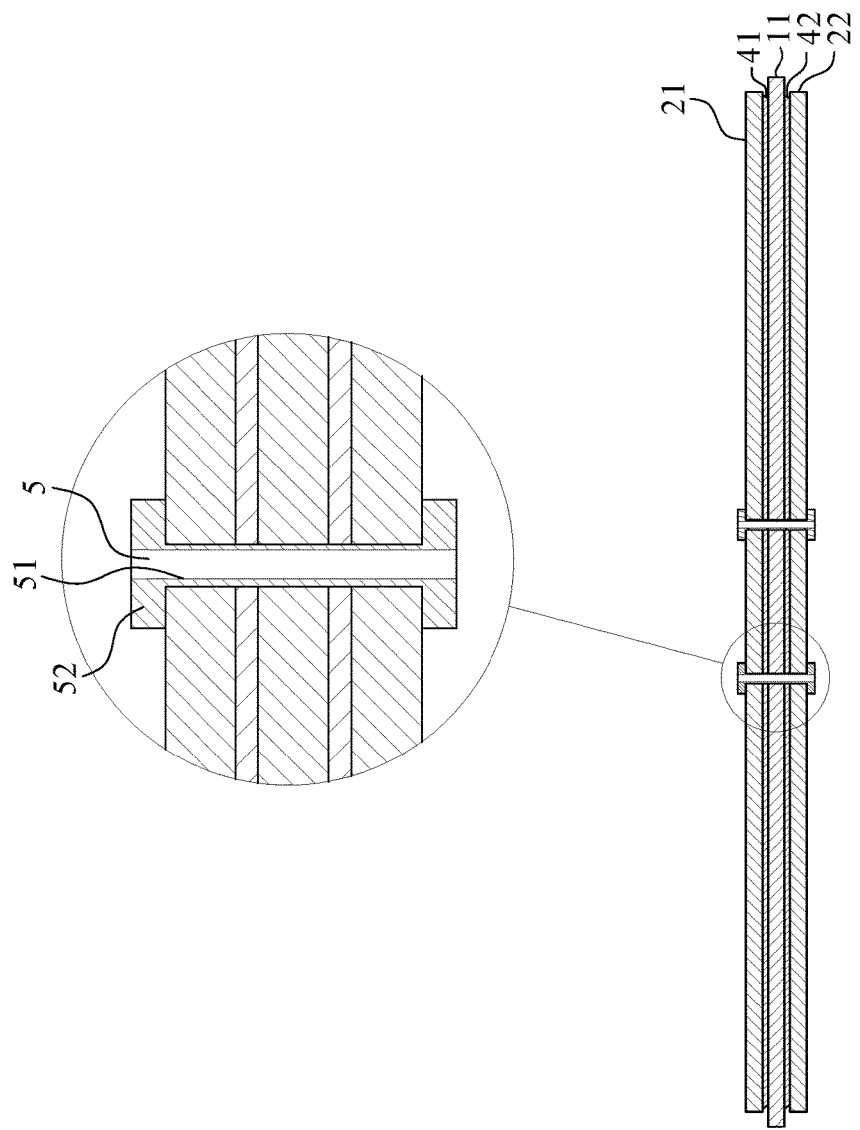
FIG. 2 is a side sectional view of the diaphragm structure according to the first embodiment of the present invention.

FIG. 1 is an exploded diagram of the diaphragm structure according to a first embodiment of the present invention; and FIG. 2 is a side sectional view of the diaphragm structure according to the first embodiment of the present invention. As shown in FIG. 1 and FIG. 2, the diaphragm structure provided according the first embodiment of the present invention mainly comprises a thin-film layer 11, a first circuit thin-film layer 21, a second circuit thin-film layer 22 and a conductive structure.

The thin-film layer 11 includes a first side 111 and a second side 112. In the present invention, non-adhesive copper is used as the first circuit thin-film layer 21 and the second circuit thin-film layer 22. The first circuit thin-film layer 21 and the second circuit thin-film layer 22 are respectively fixed to two sides of the thin-film layer 11 by ways of electrolytic bonding to form a diaphragm of a sounding apparatus such as earphones. As shown in FIG. 2, the first circuit thin-film layer 21 and the second circuit thin-film layer 22 have a first contact terminal 211 and a second contact terminal 221 respectively. The first circuit thin-film layer 21 is fixed to the first side 111 of the thin-film layer 11 via a first electrolytic bonding layer 41 by ways of electrolytic bonding, and the second circuit thin-film layer 22 is fixed to the second side 112 of the thin-film layer 11 via a second electrolytic bonding layer 42 by ways of electrolytic bonding. Please be advised that, for clarity, the thickness of the electrolytic bonding layers is not depicted in accordance with the actual scale. The actual thickness of the electrolytic bonding layers is thinner than shown in the figures. In addition, the material of the circuit thin-film layer is not limited to non-adhesive copper; any materials that are conductive and can be fixed on the thin-film layer by electrolytic bonding are suitable.

A plurality of holes 110, 210, and 220 are formed respectively on the thin-film layer 11, the first circuit thin-film layer 21 and the second circuit thin-film 22, such that perforations 5 which penetrate the diaphragm can be formed when the first circuit thin-film layer 21 and the second circuit thin-film 22 are fixed to two sides of the thin-film layer 11. As shown in FIG. 1, since four holes are formed on the thin-film layer 11, the first circuit thin-film layer 21 and the second circuit thin-film 22, the diaphragm of the present invention has a total of four perforations 5. When sounding, it is required to conduct current through the first circuit thin-film layer 21 and the second thin-film layer 22 so that the magnetic field is changed and the thin-film layer 11 is driven to vibrate the air for sounding. Thus, the inner circumferential wall of the perforations 5 is plated with a layer of conductive layer 51 by ways of selective plating to electrically connect the first circuit thin-film layer 21 and the second thin-film layer 22 with each other. As shown in FIG. 2, a covering part 52 is formed on the outer surface of the first circuit thin-film layer 21 and on the outer surface of the second thin-film layer 22 at the periphery of each of the perforations 5. The covering parts 52 are in contact with the conductive layers 51 to further ensure the electrical connection between the first circuit thin-film layer 21 and the second thin-film layer 22.

The diaphragm structure provided by the first embodiment of the present invention allows the overall thickness of the diaphragm structure to be greatly reduced by fixing the first circuit thin-film layer 21 and the second thin-film layer 22, which are composed of non-adhesive copper, to two sides of the thin-film layer 11 by electrolytic bonding; in addition, the overall thickness is also reduced by forming the conductive layers 51 in the perforations 5 by selective plating. More precisely, comparing to the conventional diaphragms, of which the metal coils are fixed to the thin-film by means of back adhesive, the diaphragm structure provided by the present invention allows the thickness of the diaphragm to be reduced from 8.75 μm to 4 μm. In this way, the dimension of the monomer of the sounding apparatus and the dimension of the sounding apparatus itself are greatly reduced. As a result, the diaphragm structure provided by the present invention is applicable to sounding apparatuses in small dimension, such as earphones.

The magnetic flux of the earphones greatly affects their sensibility of the earphones. Earphones with high magnetic flux are capable of producing louder sounds with small power. Under the condition of not increasing the plane area of the diaphragm of the earphones, it is common to increase the magnetic flux by laminating a number of metal coils. Yet, when using conventional back adhesive for ways of fixing, the overall thickness of the diaphragm may become too thick. In order to address the problem, another diaphragm structure is provided by the second and third embodiment of the present invention.

Figure 3:
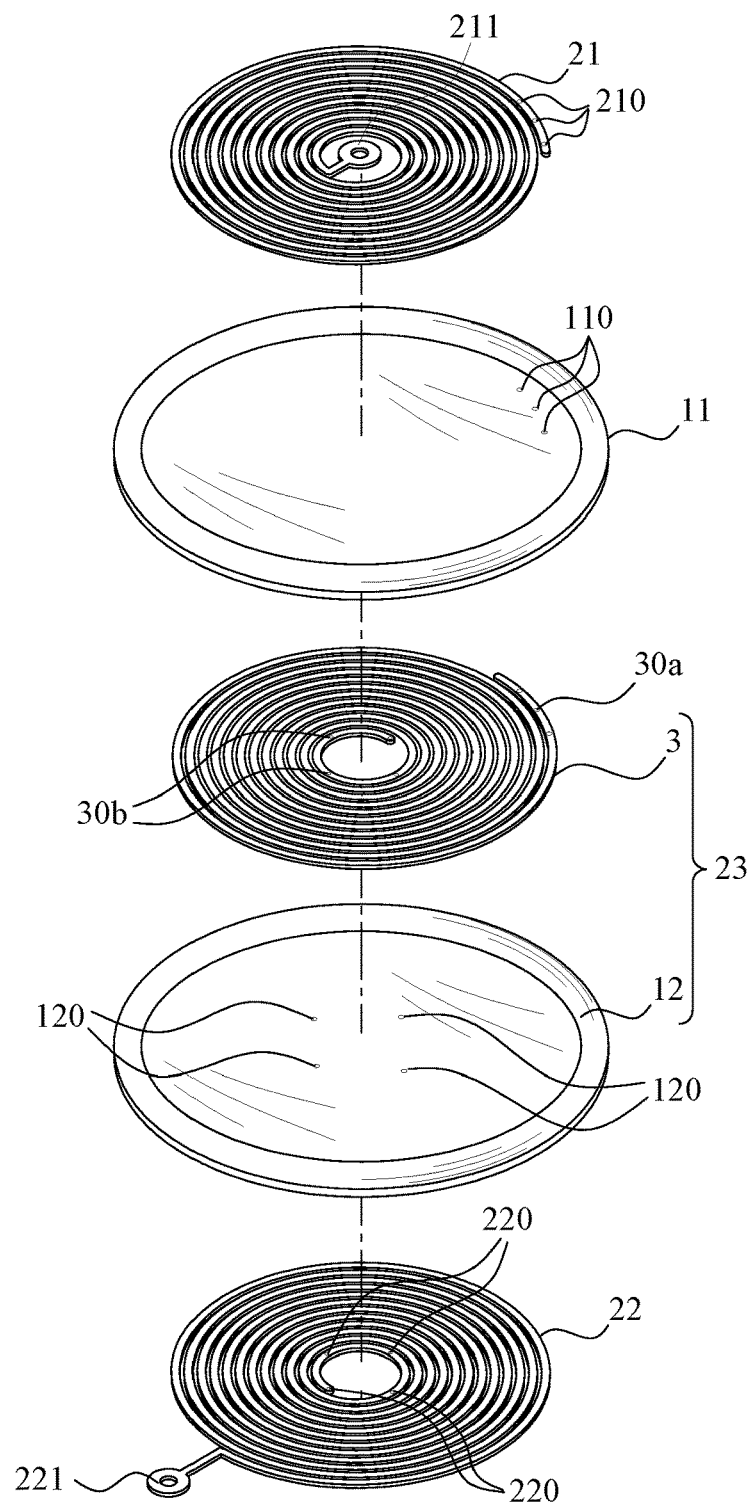
FIG. 3 is an exploded diagram of the diaphragm structure according to a second embodiment of the present invention.
Figure 4:
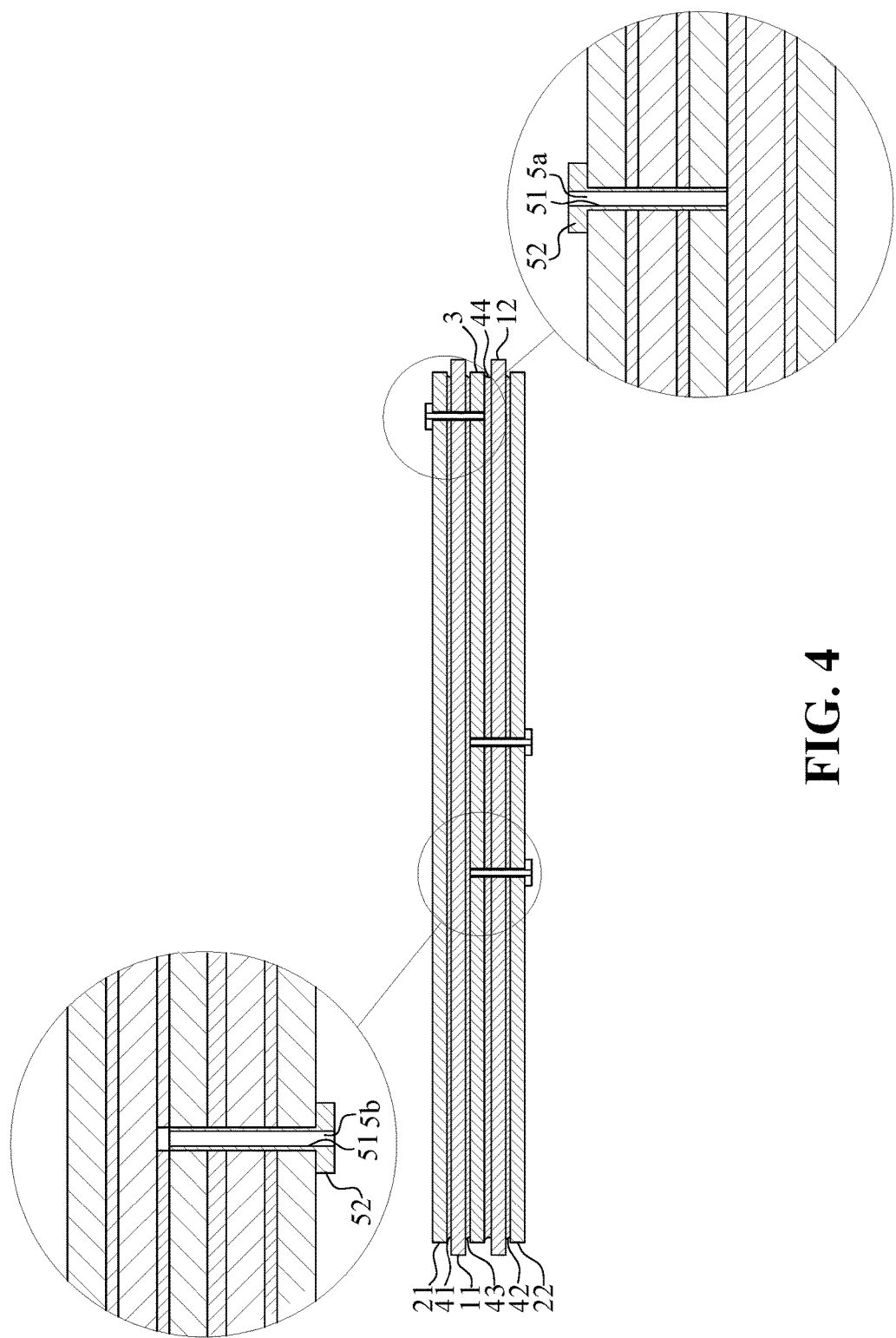
FIG. 4 is a side sectional view of the diaphragm structure according to the second embodiment of the present invention.

FIG. 3 is an exploded diagram of the diaphragm structure according to the second embodiment of the present invention; and FIG. 4 is a side sectional view of the diaphragm structure according to the second embodiment of the present invention. As shown in FIG. 3 and FIG. 4, the diaphragm structure according to the second embodiment of the present invention, similar to that according to the first embodiment, includes a thin-film layer 11, a first circuit thin-film layer 21 and a second circuit thin-film layer 22. The diaphragm structure according to the second embodiment and that according to the first embodiment are different in that a laminated layer 23 is further disposed on the diaphragm structure of the second embodiment.

Similar to the first embodiment, the thin-film layer 11 of the second embodiment has a first side 111 and a second side 112. The first circuit thin-film layer 21 and the second circuit thin-film layer 22 have a first contact terminal 211 and a second contact terminal 221 respectively, and are comprised of non-adhesive copper. The first circuit thin-film layer 21 is fixed to the first side 111 of the thin-film layer 11 via the first electrolytic bonding layer 41 by ways of electrolytic bonding. The laminated layer 23 of the second embodiment is composed of a third circuit thin-film layer 3 and a laminated thin-film layer 12. The third circuit thin-film layer 3 is fixed to the laminated layer 12 via a laminated electrolytic bonding layer 44 by ways of electrolytic bonding. As shown in FIG. 4, the third circuit thin-film layer 3 of the laminated layer 23 is fixed to the second side 112 of the thin-film layer 11 via the third electrolytic bonding layer 43 by ways of electrolytic bonding, and the second circuit thin-layer film 22 is fixed to the laminated thin-film layer 12 of the laminated layer 23 via the second electrolytic bonding layer 42 by ways of electrolytic bonding.

In the diaphragm structure provided by the present invention, every two adjacent circuit thin-film layers are connected to each other by means of at least one conductive structure. More specifically, as shown in FIG. 3, holes 210, 110 and 30a are disposed on the first circuit thin-film layer 21, the thin-film layer 11 and the third circuit thin-film layer 3 respectively, and holes 30b, 120 and 220 are disposed on the third circuit thin-film layer 3, the laminated thin-film layer 12 and the second circuit thin-film layer 22 respectively. As shown in FIG. 4, after the diaphragm structure is fixed as mentioned above, the holes 210, 110, and 30a form perforations 5a; and the holes 30b, 120 and 220 form perforations 5b. The perforations 5a and the perforations 5b are plated with a layer of conductive layer 51 by ways of selective plating. The conductive layer 51 in the perforations 5a electrically connects the first circuit thin-film layer 21 and the third circuit thin-film layer 3, and the conductive layer 51 in the perforations 5b electrically connects the third circuit thin-film layer 3 and the second circuit thin-film layer 22; as a result, a circuit between the first contact terminal 211 and the second contact terminal 221 is formed.

Besides, similar to the first embodiment, a covering part 52 is formed on the outer surface of the first circuit thin-film layer 21 at the periphery of each perforation 5a, and is also formed on the outer surface of the second circuit thin-film layer 22 at the periphery of each perforation 5b. The covering parts are in contact with the conductive layers 51 to further ensure the electrical connection between the first contact terminal 211 and the second contact terminal 221.

Via the diaphragm structure provided by the second embodiment, by laminating the metal coils, the magnetic flux of the diaphragm can be increased without greatly increasing the overall thickness of the diaphragm. Thus, the sensibility of the earphones is increased while the earphones monomer and earphones can be maintained in small dimension, so that the designers are provided with more options when designing earphones.

Figure 5:
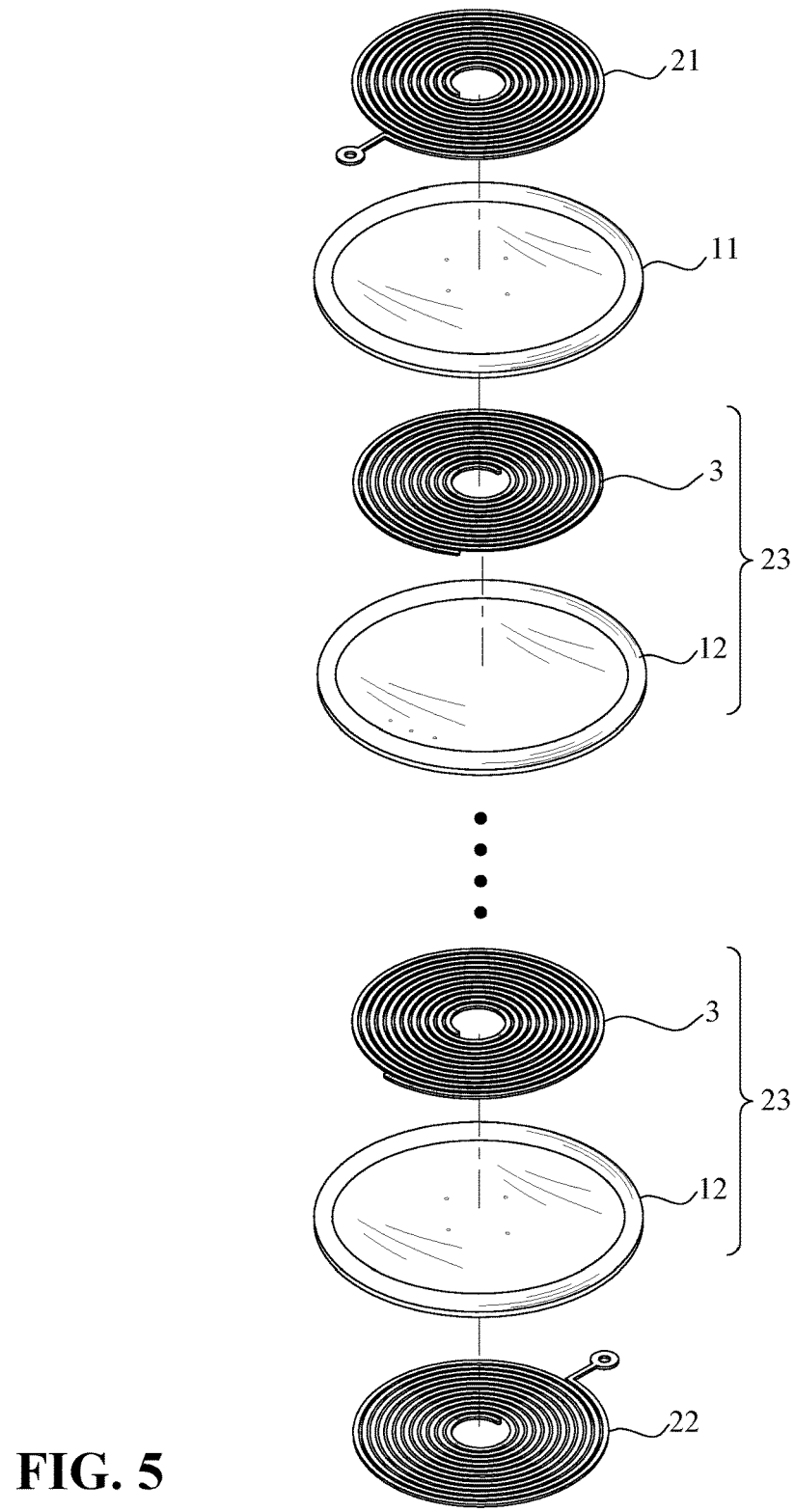
FIG. 5 is an exploded diagram of the diaphragm structure according to the third embodiment of the present invention.

The number of the laminated layers 23 in the diaphragm structure provided by the present invention is not limited to a single layer as depicted in the second embodiment. FIG. 5 shows an exploded diagram of the diaphragm structure according to the third embodiment of the present invention. As shown in FIG. 5, the diaphragm structure in the third embodiment is nearly the same as that in the second embodiment; they are different only in the number of the laminated layers 23.

In the third embodiment, the diaphragm structure has a number of N laminated layers 23. Between every two adjacent laminated layers 23, the third circuit thin-film 3 and the laminated thin-film layer 12 adjacent are fixed with each other via the electrolytic bonding layer 44 by ways of electrolytic bonding (not shown in FIG. 5). Besides, among a number of N laminated layers 23 that are laminated with each other, the third circuit thin-layer 3 at the outermost side is fixed to the second side 112 of the thin-film layer 11 via the laminated electrolytic bonding layer 44 by ways of electrolytic bonding, and the laminated thin-layer 12 at the outermost side is fixed to the second circuit thin-film layer 22 via the second electrolytic bonding layer 42 by ways of electrolytic bonding. Among the first circuit thin-film layer 21, the second circuit thin-film layer 22 and all of the third circuit thin-film layers 3 of the diaphragm structure of the third embodiment, a former one of every two adjacent circuit thin-film layers penetrates through the laminated thin-film layer or thin-film layer between two adjacent circuit thin-film layers via the conductive structure to connect the later one of two adjacent circuit thin-film layers. In such configuration, designers can modify the number of the laminated layers 23 according to the required magnetic flux for earphones.

From the embodiments above, it is clear that the diaphragm structure provided by the present invention is valuable and usable in industries. However, the description above is provided only for explanting the preferable embodiments of the present invention, but not for limiting or restricting the present invention. Thus, any modifications or alternations to the present invention without departing from the spirit of the present invention are intended to be included within the protection scope of the present invention.

What is claimed is:

1. A diaphragm structure of sounding apparatus, comprising:
   a thin-film layer having a first side and a second side;
   a first circuit thin-film layer fixed to the first side of the thin-film layer by means of a first electrolytic bonding layer and having a first contact terminal at one end;
   at least one laminated layer, each of the laminated layer including:
      a third circuit thin-film layer; and
      a laminated thin-film layer fixed to the third circuit thin-film layer by means of a laminated electrolytic bonding layer;
   wherein the third circuit thin-film layer at an outermost side of the at least one laminated layer is fixed to the second side of the thin-film layer by means of a third electrolytic bonding layer;
   a second circuit thin-film layer fixed to the laminated thin-film layer at another outermost side of the at least one laminated layer by means of a second electrolytic bonding layer and having a second contact terminal at one end; and
   a plurality of conductive structures;
   wherein every two adjacent circuit thin-film layers among the first circuit thin-film layer, the second circuit thin-film layer and the at least one third circuit thin-film layer are connected to each other by means of at least one of the conductive structures.

2. The diaphragm structure according to claim 1, wherein each of the conductive structures includes:
   a perforation penetrating from one of the two adjacent circuit thin-film layers through the laminated thin-film layer or the thin-film layer between the two adjacent circuit thin-film layers to the other of the two adjacent circuit thin-film layers; and
   a conductive layer disposed on an inner circumferential wall of the perforation and in contact with two adjacent circuit thin-film layers.

3. The diaphragm structure according to claim 2, further comprising a plurality of covering parts disposed on an outer surface of the first circuit thin-film layer and on an outer surface of the second circuit thin-film layer around the perforations, and the covering parts being in contact with the conductive layers in the perforations.

4. The diaphragm structure according to claim 1, comprising a plurality of the laminated layers, wherein every two laminated layers are fixed with each other by means of the laminated electrolytic bonding layer in between.

5. The diaphragm structure according to claim 1, wherein in a thickness direction of the diaphragm structure,
   the first electrolytic bonding layer is arranged between the first circuit thin-film layer and the first side of the thin-film layer, and bonds the first circuit thin-film layer to the first side of the thin-film layer,
   the second electrolytic bonding layer is arranged between the second circuit thin-film layer and the laminated thin-film layer, and bonds the second circuit thin-film layer to the laminated thin-film layer, and
   the third electrolytic bonding layer is arranged between the third circuit thin-film layer at the outermost side of the at least one laminated layer and the second side of the thin-film layer, and bonds the third circuit thin-film layer at the outermost side of the at least one laminated layer to the second side of the thin-film layer.

* * * * *